United States Patent
Chai et al.

(10) Patent No.: US 9,608,637 B2
(45) Date of Patent: Mar. 28, 2017

(54) DYNAMIC VOLTAGE LEVEL SHIFTERS EMPLOYING PULSE GENERATION CIRCUITS, AND RELATED SYSTEMS AND METHODS

(71) Applicant: QUALCOMM Incorporated, San Diego, CA (US)

(72) Inventors: Chiaming Chai, Cary, NC (US); Shaoping Ge, Cary, NC (US); Stephen Edward Liles, Apex, NC (US); Chintan Hemendrakumar Shah, Apex, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/827,125

(22) Filed: Aug. 14, 2015

(65) Prior Publication Data

US 2017/0047930 A1 Feb. 16, 2017

(51) Int. Cl.
*H03K 19/20* (2006.01)
*H03K 19/0185* (2006.01)

(52) U.S. Cl.
CPC ..... *H03K 19/018528* (2013.01); *H03K 19/20* (2013.01)

(58) Field of Classification Search
None
See application file for complete search history.

(56) References Cited

U.S. PATENT DOCUMENTS

| | | | | |
|---|---|---|---|---|
| 5,221,867 A * | 6/1993 | Mitra | ............... | H03K 19/1772 326/29 |
| 5,880,608 A * | 3/1999 | Mehta | ............... | H03K 19/096 326/121 |
| 5,959,465 A * | 9/1999 | Beat | ............... | H03K 19/1772 326/39 |
| 6,531,897 B1 * | 3/2003 | Milshtein | ............ | H03K 19/0966 326/121 |
| 6,542,006 B1 * | 4/2003 | Sprague | ............ | H03K 19/0966 326/93 |
| 6,567,337 B1 * | 5/2003 | Sprague | ............ | G11C 7/1078 365/189.05 |

(Continued)

OTHER PUBLICATIONS

International Search Report and Written Opinion for PCT/US2016/046114, mailed Oct. 19, 2016, 15 pages.

*Primary Examiner* — Crystal L Hammond
(74) *Attorney, Agent, or Firm* — Withrow & Terranova, PLLC (57) ABSTRACT

Dynamic voltage level shifters employing pulse generation circuits are disclosed. In one aspect, a dynamic voltage level shifter includes a dynamic voltage level shifting circuit. The dynamic voltage level shifting circuit includes a pre-charge circuit configured to provide supply voltage of a first voltage domain to a dynamic node in response to a clock signal having pre-charge voltage. An evaluate circuit is configured to provide ground voltage to the dynamic node in response to an input signal having an active voltage while the clock signal has evaluate voltage. A keeper circuit is configured to provide a reduced drive strength to the dynamic node in response to pulse signal. The pulse signal is generated by a pulse generation circuit, wherein a pulse width of the pulse signal correlates to a difference in supply voltages of first and second voltage domains.

27 Claims, 7 Drawing Sheets

(56) References Cited

U.S. PATENT DOCUMENTS

| | | |
|---|---|---|
| 7,245,172 B2 | 7/2007 | Boerstler et al. |
| 7,667,490 B2 | 2/2010 | Fu et al. |
| 7,683,667 B2 | 3/2010 | Kim et al. |
| 7,755,393 B1 | 7/2010 | Song |
| 7,772,891 B1 * | 8/2010 | Yang .............. G01R 31/318533 326/95 |
| 7,986,165 B1 | 7/2011 | Lin et al. |
| 8,362,806 B2 | 1/2013 | Wijeratne et al. |
| 2005/0110522 A1 * | 5/2005 | Hoekstra ............ H03K 19/0963 326/95 |
| 2005/0127950 A1 * | 6/2005 | Ngo ........................ H03K 3/012 326/95 |
| 2006/0103430 A1 * | 5/2006 | Yuan ................. H03K 19/0963 326/97 |
| 2009/0102508 A1 * | 4/2009 | Agarwal ................ H03M 11/02 326/16 |
| 2013/0335152 A1 | 12/2013 | Burnette et al. |

* cited by examiner

DYNAMIC VOLTAGE LEVEL SHIFTERS EMPLOYING PULSE GENERATION CIRCUITS, AND RELATED SYSTEMS AND METHODS

BACKGROUND

I. Field of the Disclosure

The technology of the disclosure relates generally to voltage level shifters for shifting input signals in one voltage domain to output signals in another voltage domain, and particularly to reducing area of voltage level shifters.

II. Background

Processor-based systems may be powered by one or more power supplies, wherein such power supplies provide voltage for processor operations. Particular components within a processor-based system may use less voltage to operate as compared to other components within the same system. For example, a processor in a processor-based system may use less voltage to operate during idle modes, but memory may use a higher minimum voltage to retain data. In this regard, rather than providing a single higher voltage supply to all components in a processor-based system, components of the processor-based system can be configured to operate in multiple voltage domains. Components that operate at a lower voltage are powered by a lower voltage supply in a lower voltage domain, while components that operate at a higher voltage are powered by a higher voltage supply in a higher voltage domain. In this manner, power is conserved as opposed to providing a higher voltage to all components, including components that can operate at a lower voltage.

However, so that signals from components in one voltage domain operating from a first voltage supply can be compatibly provided and processed by components operating from a second voltage supply in another voltage domain, voltage level shifters are employed. Voltage level shifters shift signals from a lower voltage domain to a higher voltage domain, or vice versa. For example, voltage level shifters can shift a logic high ('1') voltage in the lower voltage domain (e.g., 0.5 V) to a logic high ('1') voltage in the higher voltage domain (e.g., 1.0 V). Voltage level shifters may be implemented using static or dynamic logic. In this manner, static voltage level shifters provide an output signal in response to a change in a state of an input signal. Alternatively, dynamic voltage level shifters change an output signal in response to a change in a state of a clock signal. Conventionally, a dynamic voltage level shifter precharges a node to a known voltage during a pre-charge state. The voltage may be held by a keeper circuit or changed by an evaluate circuit during an evaluate state based on a state of an input signal, wherein the voltage on the node is used to produce an output signal of a dynamic voltage level shifter.

Notably, as the difference in supply voltages between the higher voltage domain and the lower voltage domain increases, components within a voltage level shifter are configured so as to reduce or avoid producing erroneous signals. For example, as the difference in supply voltages in the higher and lower voltage domains increases, an input signal in the lower voltage domain may concurrently partially activate an evaluate circuit and a keeper circuit in a dynamic voltage level shifter, potentially leading to erroneous output signals. To prevent such concurrent activation of the evaluate circuit and keeper circuits, the evaluate circuit can be configured to be stronger than the keeper circuit. Conventionally, to configure the evaluate circuit to be stronger than the keeper circuit, the evaluate circuit may be designed with a larger size, thus resulting in an increase in area of the dynamic voltage level shifter. Therefore, it would be advantageous to employ a dynamic voltage level shifter that reduces or avoids producing erroneous signals as the difference in supply voltages of the higher and lower voltage domains increases, while mitigating or eliminating an increase in area.

SUMMARY OF THE DISCLOSURE

Aspects disclosed in the detailed description include dynamic voltage level shifters employing pulse generation circuits. Related systems and methods are also disclosed. In one exemplary aspect, a dynamic voltage level shifter employing a pulse generation circuit is provided. The dynamic voltage level shifter includes a dynamic voltage level shifting circuit. The dynamic voltage level shifting circuit includes a pre-charge circuit that is configured to provide a supply voltage of a first voltage domain to a dynamic node in response to a clock signal in a first voltage domain having a pre-charge voltage. The dynamic voltage level shifting circuit also includes an evaluate circuit that is configured to provide a ground voltage to the dynamic node in response to an input signal in a second voltage domain having an active voltage while the clock signal has an evaluate voltage. Further, a keeper circuit in the dynamic voltage level shifting circuit is coupled to the dynamic node, and is configured to provide a reduced drive strength to the dynamic node in response to a pulse signal. In other words, the voltage and current provided by the keeper circuit to drive the dynamic node is reduced in response to the pulse signal. Lowering the drive strength of the keeper circuit allows the evaluate circuit to drive the dynamic node to the ground voltage with less competition from the keeper circuit. In this manner, the pulse signal is used to avoid concurrent activation of the keeper circuit and evaluate circuit.

Notably, the pulse signal is generated by the pulse generation circuit, wherein a pulse width of the pulse signal is dependent on a difference in the supply voltages of the first and second voltage domains. Thus, the keeper circuit provides the reduced drive strength for an amount of time (i.e., the duration of the pulse width) correlating to the difference in supply voltages of the first and second voltage domains. In this manner, the pulse generation circuit enables the evaluate circuit to drive the dynamic node to the ground voltage with less competition from the keeper circuit, even as the difference in the supply voltages increases.

In this regard in one aspect, a dynamic voltage level shifter is provided. The dynamic voltage level shifter comprises a dynamic voltage level shifting circuit. The dynamic voltage level shifting circuit comprises a pre-charge circuit configured to provide a supply voltage of a first voltage domain to a dynamic node in response to a clock signal in the first voltage domain having a pre-charge voltage. The dynamic voltage level shifting circuit further comprises an evaluate circuit configured to provide a ground voltage to the dynamic node in response to an input signal in a second voltage domain while the clock signal has an evaluate voltage. The dynamic voltage level shifting circuit further comprises a keeper circuit configured to provide a reduced drive strength to the dynamic node in response to a pulse signal. The dynamic voltage level shifter further comprises a pulse generation circuit configured to generate the pulse signal, wherein a pulse width of the pulse signal correlates to a difference in the supply voltage of the first voltage domain and a supply voltage of the second voltage domain.

In another aspect, a dynamic voltage level shifter is provided. The dynamic voltage level shifter comprises a means for pre-charging a dynamic node to a supply voltage of a first voltage domain in response to a clock signal in the first voltage domain having a pre-charge voltage. The dynamic voltage level shifter further comprises a means for providing a ground voltage to the dynamic node in response to an input signal in a second voltage domain while the clock signal has an evaluate voltage. The dynamic voltage level shifter further comprises a means for providing a reduced drive strength to the dynamic node in response to a pulse signal. The dynamic voltage level shifter further comprises a means for generating the pulse signal, wherein a pulse width of the pulse signal correlates to a difference in the supply voltage of the first voltage domain and a supply voltage of the second voltage domain.

In another aspect, a method for voltage level shifting is provided. The method comprises pre-charging a dynamic node to a supply voltage of a first voltage domain in response to a clock signal in the first voltage domain having a pre-charge voltage. The method further comprises providing a ground voltage to the dynamic node in response to an input signal in a second voltage domain while the clock signal has an evaluate voltage. The method further comprises generating a pulse signal, wherein a pulse width of the pulse signal correlates to a difference in the supply voltage of the first voltage domain and a supply voltage of the second voltage domain. The method further comprises providing a reduced drive strength to the dynamic node by a keeper circuit in response to the pulse signal.

In another aspect, a dynamic voltage level shifting system is provided. The dynamic voltage level shifting system comprises a plurality of voltage level shifting circuits. Each voltage level shifting circuit of the plurality of voltage level shifting circuits comprises a pre-charge circuit configured to provide a supply voltage of a first voltage domain to a dynamic node in response to a clock signal in the first voltage domain having a pre-charge voltage. Each voltage level shifting circuit of the plurality of voltage level shifting circuits further comprises an evaluate circuit configured to provide a ground voltage to the dynamic node in response to an input signal in a second voltage domain while the clock signal has an evaluate voltage. Each voltage level shifting circuit of the plurality of voltage level shifting circuits further comprises a keeper circuit configured to provide a reduced drive strength to the dynamic node in response to a pulse signal. The dynamic voltage level shifting system further comprises a pulse generation circuit configured to generate the pulse signal, wherein a pulse width of the pulse signal correlates to a difference in the supply voltage of the first voltage domain and a supply voltage of the second voltage domain.

DETAILED DESCRIPTION

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Figure 1:
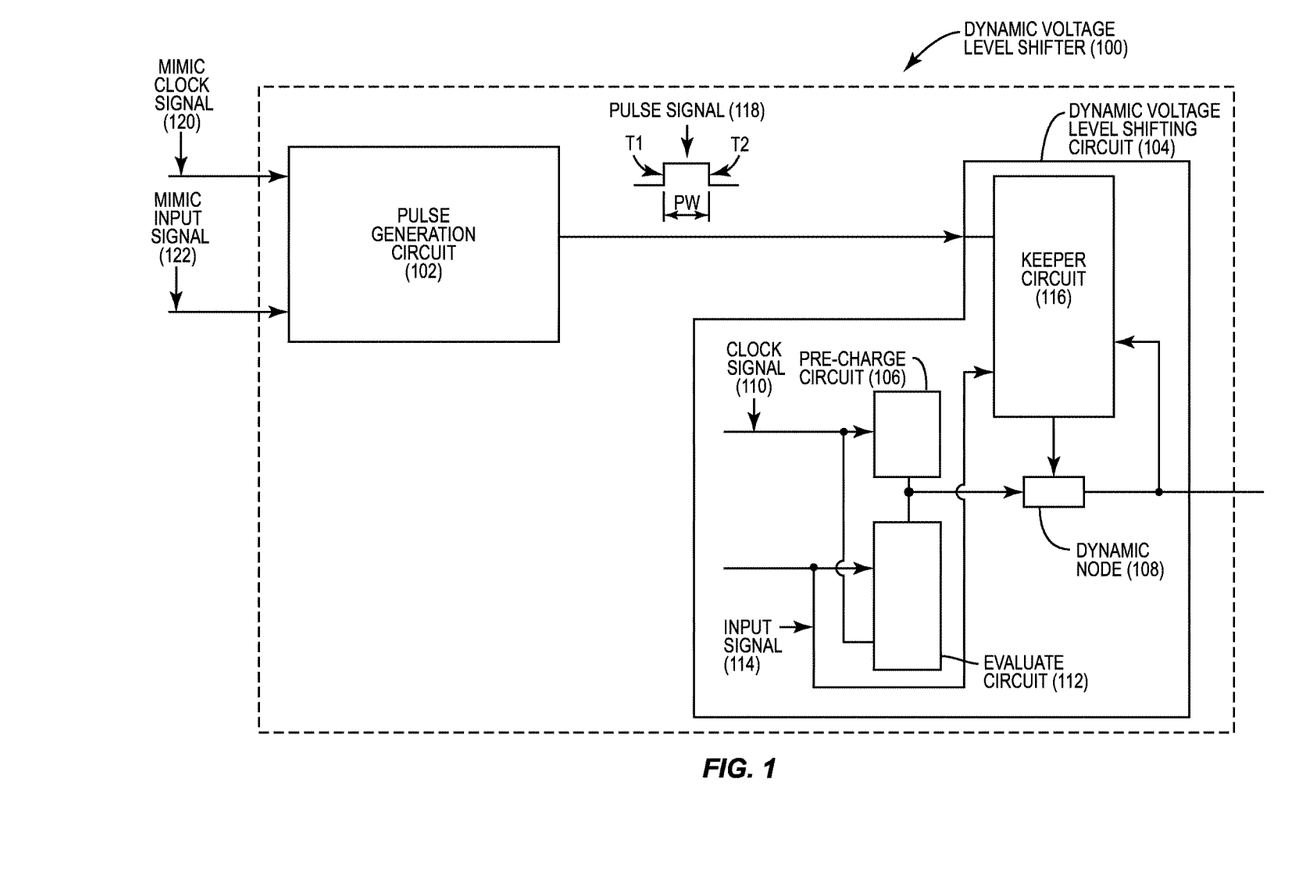
FIG. 1 is a block diagram of an exemplary dynamic voltage level shifter employing a pulse generation circuit configured to generate a pulse signal so as to reduce a drive strength of a keeper circuit of a dynamic voltage level shifting circuit correlated to a difference in supply voltages of first and second voltage domains.

FIG. 1 illustrates an exemplary dynamic voltage level shifter 100 employing a pulse generation circuit 102 and a dynamic voltage level shifting circuit 104. The dynamic voltage level shifting circuit 104 includes a pre-charge circuit 106 that is configured to provide a supply voltage of a first voltage domain to a dynamic node 108 in response to a clock signal 110 in the first voltage domain having a pre-charge voltage (e.g., a logic low '0' voltage). The dynamic voltage level shifting circuit 104 also includes an evaluate circuit 112 that is configured to provide a ground voltage to the dynamic node 108 in response to an input signal 114 in a second voltage domain having an active voltage (e.g., a logic high '1' voltage) while the clock signal 110 has an evaluate voltage (i.e., a logic high '1' voltage). The dynamic voltage level shifting circuit 104 also employs a keeper circuit 116 that is coupled to the dynamic node 108. Notably, the keeper circuit 116 is configured to provide a reduced drive strength to the dynamic node 108 in response to a pulse signal 118. In other words, the voltage and current provided by the keeper circuit 116 to drive the dynamic node 108 is reduced in response to the pulse signal 118. Lowering the drive strength of the keeper circuit 116 enables the evaluate circuit 112 to drive the dynamic node 108 to the ground voltage with less competition from the keeper circuit 116. In this manner, the pulse signal 118 is used to avoid partial concurrent activation of the keeper circuit 116 and evaluate circuit 112, and thus reduce or avoid generating erroneous signals.

With continuing reference to FIG. 1, the pulse signal 118 is generated by the pulse generation circuit 102. A pulse width (PW) of the pulse signal 118 correlates to a difference in the supply voltages of the first voltage domain and second voltage domain. Thus, the keeper circuit 116 provides the reduced drive strength for an amount of time (i.e., the duration of the pulse width (PW)) correlated to the difference in supply voltages of the first and second voltage domains. As discussed in greater detail below, the pulse generation circuit 102 is configured to generate a first transition (T1) of the pulse signal 118 in response to a signal in the first voltage domain. Further, the pulse generation circuit 102 is configured to generate a second transition (T2) of the pulse signal 118 in response to a signal in the second voltage domain. In this example, a mimic clock signal 120 in the first voltage domain is provided to the pulse generation circuit 102 and used to generate the first transition (T1) of the pulse signal 118. Further, a mimic input signal 122 in the second voltage domain is provided to the pulse generation circuit 102 and used to generate a second transition (T2) of the pulse signal 118. Notably, in this example, the mimic clock signal 120 and the mimic input signal 122 are synchronous. In this manner, the pulse generation circuit 102 enables the evaluate circuit 112 to drive the dynamic node 108 to the ground voltage with less competition from the keeper circuit 116, even as the difference in the supply voltages increases.

Notably, elements of the dynamic voltage level shifter 100 described above may also be referred to herein as means for performing particular functions. In this manner, the pre-charge circuit 106 is sometimes referred to herein as a means for pre-charging the dynamic node 108 to the supply voltage of the first voltage domain in response to the clock signal 110 having a pre-charge voltage. The evaluate circuit 112 is sometimes referred to herein as a means for providing the ground voltage to the dynamic node 108 in response to the input signal 114 while the clock signal 110 has an evaluate voltage. The keeper circuit 116 is sometimes referred to herein as a means for providing a reduced drive strength to the dynamic node 108 in response to the pulse signal 118. Further, the pulse generation circuit 102 is sometimes referred to herein as a means for generating the pulse signal 118. As noted above, the pulse width (PW) of the pulse signal 118 correlates to a difference in the supply voltage of the first voltage domain and the supply voltage of the second voltage domain.

Figure 2:
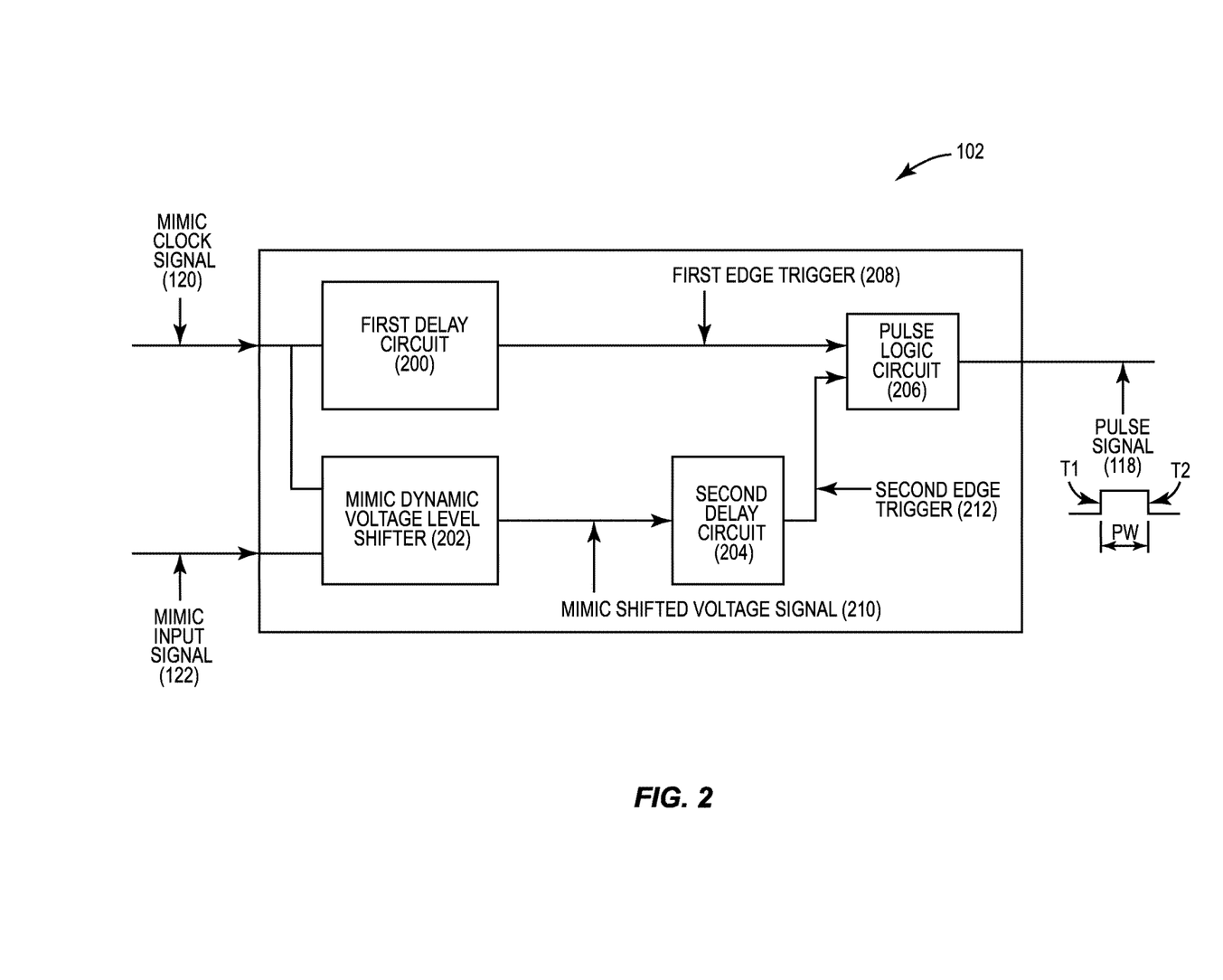
FIG. 2 is a block diagram of an exemplary pulse generation circuit employed in the dynamic voltage level shifter in FIG. 1.

To provide further details of the pulse generation circuit 102, FIG. 2 illustrates a block diagram of the pulse generation circuit 102 employed in the dynamic voltage level shifter 100 in FIG. 1. As noted above, the pulse generation circuit 102 is configured to receive the mimic clock signal 120 and the mimic input signal 122. As a non-limiting example, the mimic clock signal 120 mimics the timing of the clock signal 110. Additionally, the mimic input signal 122 mimics the timing of the input signal 114. Further, to generate the pulse signal 118 with the pulse width (PW) correlated to the difference in the supply voltages of the first and second voltage domains, the pulse generation circuit 102 employs a first delay circuit 200, a mimic dynamic voltage level shifter 202, a second delay circuit 204, and a pulse logic circuit 206. In this manner, the first delay circuit 200 is configured to receive the mimic clock signal 120 in the first voltage domain, and delay the mimic clock signal 120 based on a number of stages designed in the first delay circuit 200. The first delay circuit 200 is also configured to provide a first edge trigger 208 to the pulse logic circuit 206. As described in greater detail below, generating the first edge trigger 208 using the first delay circuit 200 results in generating the first transition (T1) in response to a signal in the first voltage domain.

With continuing reference to FIG. 2, the mimic dynamic voltage level shifter 202 is configured to receive the mimic clock signal 120 in the first voltage domain and the mimic input signal 122 in the second voltage domain. Notably, in this example, the mimic dynamic voltage level shifter 202 is designed to mimic the circuitry and operation of the dynamic voltage level shifter 100 in FIG. 1, except that the mimic dynamic voltage level shifter 202 does not operate using a signal similar to the pulse signal 118. Rather, the mimic dynamic voltage level shifter 202 is designed such that a keeper circuit (not shown) and an evaluate circuit (not shown) within the mimic dynamic voltage level shifter 202 avoid concurrent partial activation (e.g., the keeper and evaluate circuits are sized so as to avoid concurrent partial activation). Notably, the mimic dynamic voltage level shifter 202 is designed to avoid such concurrent partial activation even if the difference in the supply voltages of the first and second voltage domains is relatively large. In this manner, the mimic dynamic voltage level shifter 202 is configured to provide a mimic shifted voltage signal 210 in the first voltage domain. Further, the second delay circuit 204 is configured to receive the mimic shifted voltage signal 210 and delay the mimic shifted voltage signal 210 based on a number of stages designed in the second delay circuit 204. In this manner, the second delay circuit 204 is configured to provide a second edge trigger 212 to the pulse logic circuit 206. As described in greater detail below, generating the second edge trigger 212 in this manner results in generating the second transition (T2) in response to a signal in the second voltage domain.

With continuing reference to FIG. 2, the pulse logic circuit 206 is configured to receive the first edge trigger 208 and the second edge trigger 212, and provide the pulse signal 118. As a non-limiting example, if the mimic clock signal 120 has a pre-charge voltage (e.g., a logic low '0' voltage), the first edge trigger 208 is equal to a logic low '0' voltage, and the second edge trigger 212 is equal to a logic high '1' voltage. When the first and second edge triggers 208, 212 equal the logic low '0' and logic high '1' voltages, respectively, the pulse logic circuit 206 is configured to not generate the pulse signal 118 (e.g., the pulse signal 118 has a logic low '0' voltage). Further, in response to the mimic clock signal 120 transitioning to an evaluate voltage (e.g., a logic high '1' voltage), the first edge trigger 208 transitions to a logic high '1' voltage following a delay. The delay of the first edge trigger 208 is determined by the delay of the first delay circuit 200. Additionally, in response to the mimic clock signal 120 transitioning to an evaluate voltage (e.g., a logic high '1' voltage), the second edge trigger 212 may transition based on the state of the mimic input signal 122. The delay of the second edge trigger 212 may be based on the speed of the mimic dynamic voltage level shifter 202 and the delay of the second delay circuit 204. In this aspect, the pulse logic circuit 206 is configured to generate the first transition (T1) if the first edge trigger 208 and the second edge trigger 212 equal the evaluate voltage (e.g., a logic high '1' voltage). Further, the pulse logic circuit 206 is configured to generate the second transition (T2) of the pulse signal 118 if the second edge trigger 212 transitions to the pre-charge voltage (e.g., a logic low '0' voltage) while the first edge trigger 208 is equal to the evaluate voltage (e.g., a logic high '1' voltage). In this manner, the pulse signal 118 has a pulse width (PW) correlated to the difference in the supply voltages of the first and second voltage domains.

Figure 3:
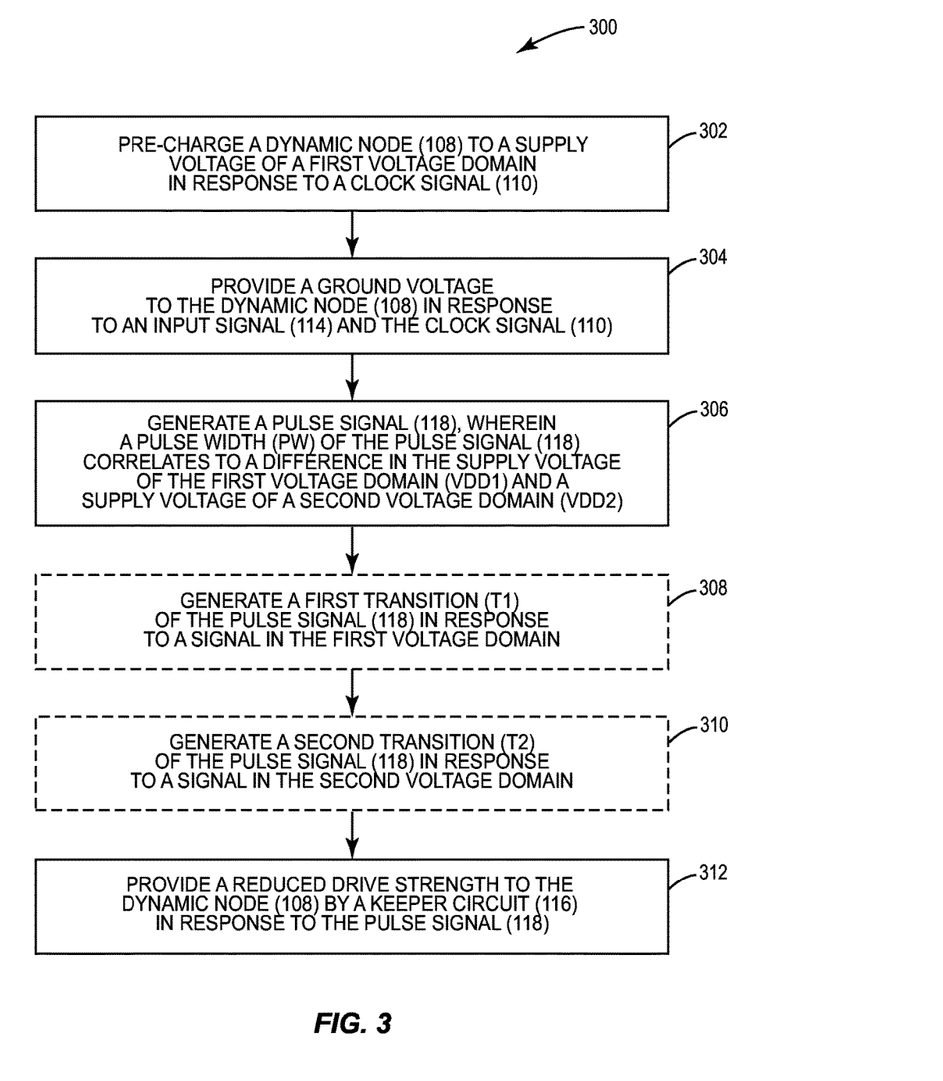
FIG. 3 is a flowchart illustrating an exemplary process employed by the dynamic voltage level shifter in FIG. 1 to shift voltage domains of a signal while reducing the drive strength of the keeper circuit correlated to a difference in the supply voltages of the first and second voltage domains.

In this regard, FIG. 3 illustrates an exemplary process 300 employed by the dynamic voltage level shifter 100 in FIG. 1 to voltage level shift the input signal 114. The process 300 includes pre-charging the dynamic node 108 to the supply voltage of the first voltage domain in response to the clock signal 110 having a pre-charge voltage (block 302). The process 300 further includes providing the ground voltage to the dynamic node 108 in response to the input signal 114 having an active voltage while the clock signal 110 has an evaluate voltage (block 304). Additionally, the process 300 includes generating the pulse signal 118, wherein the pulse width (PW) of the pulse signal 118 correlates to the difference in the supply voltage of the first voltage domain and the supply voltage of the second voltage domain (block 306). Generating the pulse signal 118 in block 306 may include generating the first transition (T1) of the pulse signal 118 in response to a signal in the first voltage domain (block 308). Generating the pulse signal 118 in block 306 may also include generating the second transition (T2) of the pulse signal 118 in response to a signal in the second voltage domain (block 310). Further, the process 300 includes providing a reduced drive strength to the dynamic node 108 by the keeper circuit 116 in response to the pulse signal 118 (block 312). Thus, the keeper circuit 116 provides the reduced drive strength for an amount of time (i.e., the duration of the pulse width (PW)) correlated to the difference in supply voltages of the first and second voltage domains, VDD1 and VDD2, respectively. By weakening the keeper circuit 116 in this manner, the pulse generation circuit 102 enables the dynamic voltage level shifter 100 to transition to the ground voltage (GND), even as the difference in the supply voltages increases.

Figure 4:
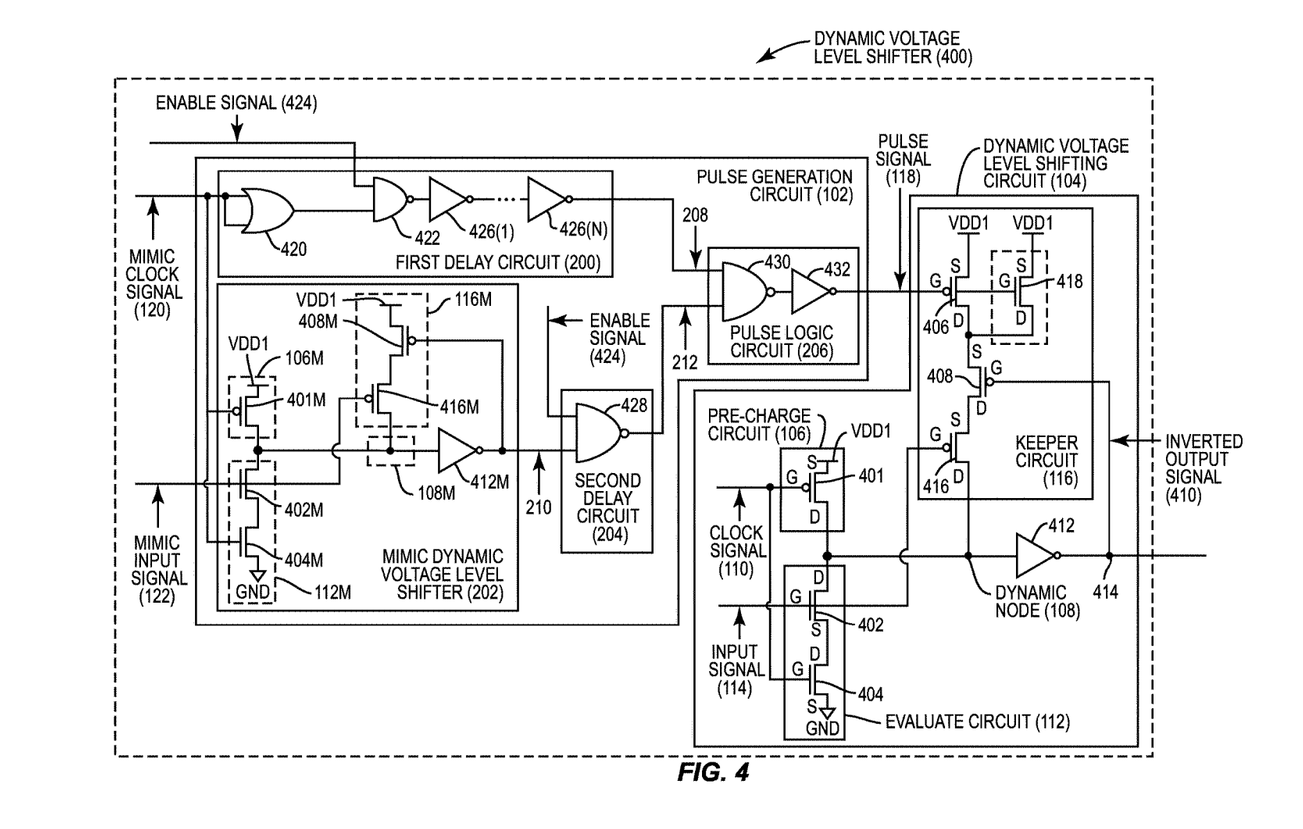
FIG. 4 is a circuit diagram of an exemplary dynamic voltage level shifter employing the pulse generation circuit of FIG. 2 configured to generate a pulse signal so as to reduce a drive strength of a keeper circuit of a dynamic voltage level shifting circuit correlated to a difference in supply voltages of a first and second voltage domain.

In this regard, FIG. 4 illustrates a circuit diagram of an exemplary dynamic voltage level shifter 400 employing the pulse generation circuit 102. The dynamic voltage level shifter 400 includes certain components in common with the dynamic voltage level shifter 100 in FIG. 1 and the pulse generation circuit 102 in FIG. 2, which are shown with common element numbers between FIGS. 1, 2, and 4. In this manner, the pre-charge circuit 106 includes a p-type metal-oxide semiconductor (PMOS) transistor 401. The PMOS transistor 401 includes a source (S) configured to receive the supply voltage of the first voltage domain (VDD1), a gate (G) configured to receive the clock signal 110, and a drain (D) coupled to the dynamic node 108. Further, the evaluate circuit 112 includes a first n-type metal-oxide semiconductor (NMOS) transistor 402 and a second NMOS transistor 404. The first NMOS transistor 402 includes a gate (G) configured to receive the input signal 114 in the second voltage domain, a drain (D) coupled to the dynamic node 108, and a source (S) coupled to a drain (D) of the second NMOS transistor 404. Further, the second NMOS transistor 404 includes a gate (G) configured to receive the clock signal 110 and a source (S) configured to receive the ground voltage (GND).

With continuing reference to FIG. 4, the keeper circuit 116 includes a first PMOS transistor 406. The first PMOS transistor 406 includes a source (S) configured to receive the supply voltage of the first voltage domain (VDD1) and a gate (G) configured to receive the pulse signal 118. The first PMOS transistor 406 also includes a drain (D) configured to provide the supply voltage of the first voltage domain (VDD1) when the pulse signal 118 has a logic low '0' voltage, and to provide no voltage when the pulse signal 118 has a logic high '1' voltage. In other words, the first PMOS transistor 406 may be employed to gate off the supply voltage of the first voltage domain (VDD1) in response to the pulse signal 118. Further, the keeper circuit 116 includes a second PMOS transistor 408 that includes a source (S) coupled to the drain (D) of the first PMOS transistor 406, a gate (G) configured to receive an inverted dynamic node signal 410, and a drain (D). Notably, the inverted dynamic node signal 410 is generated by an inverter 412 that is configured to invert the voltage on the dynamic node 108 to produce a voltage on a dynamic voltage level shifter output 414. The keeper circuit 116 also includes a third PMOS transistor 416. The third PMOS transistor 416 includes a source (S) coupled to the drain (D) of the second PMOS transistor 408, a gate (G) configured to receive the input signal 114, and a drain (D) coupled to the dynamic node 108. Notably, in some aspects, the keeper circuit 116 also employs an NMOS transistor 418 that includes a source (S) configured to receive the supply voltage of the first voltage domain (VDD1), a gate (G) configured to receive the pulse signal 118, and a drain (D) coupled to the source (S) of the second PMOS transistor 408. Notably, the drain (D) of the NMOS transistor 418 is configured to provide a voltage approximately equal to the supply voltage of the first voltage domain minus a threshold voltage (Vt) of the NMOS transistor 418 in response to the pulse signal 118. In this manner, the NMOS transistor 418 may be employed to reduce the voltage provided by the keeper circuit 116 by the threshold voltage (Vt) of the NMOS transistor 418 in response to the pulse signal 118, rather than allowing the first PMOS transistor 406 to gate off the supply voltage (VDD1) as previously described.

With continuing reference to FIG. 4, a non-limiting example is now described. Notably, in this aspect, the supply voltage of the first voltage domain has a higher voltage (e.g., 1.0 V) than the supply voltage of the second voltage domain (e.g., 0.5 V). In this manner, prior to performing the voltage shifting function, the clock signal 110 has a pre-charge voltage (e.g., a logic low '0' voltage). Thus, the clock signal 110 turns-on the PMOS transistor 401 in the pre-charge circuit 106 and turns-off the second NMOS transistor 404 in the evaluate circuit 112. The dynamic node 108 is driven to the supply voltage of the first voltage domain (e.g., 1.0 V) during the pre-charge state. To initiate the voltage shifting function, the clock signal 110 transitions to the evaluate voltage (e.g., a logic high '1' voltage), thus deactivating the PMOS transistor 401 and activating the second NMOS transistor 404. While the clock signal 110 equals the evaluate voltage, if the input signal 114 has a logic low '0' voltage, the first NMOS transistor 402 is turned-off and the dynamic node 108 remains at the supply voltage of the first voltage domain (VDD1) (e.g., 1.0 V). Conversely, while the clock signal 110 has the evaluate voltage, if the input signal 114 has a logic high '1' voltage, the first NMOS transistor 402 is turned-on while the third PMOS transistor 416 of the keeper circuit 116 is partially turned-off. Thus, the ground voltage (GND) is provided to the dynamic node 108. Notably, without the use of the pulse generation circuit 102, the source (S) of the third PMOS transistor 416 may receive the supply voltage of the first voltage domain (VDD1) (e.g., 1.0 V) for a time period while the clock signal 110 equals the evaluate voltage until the dynamic node 108 is driven to a voltage capable of forcing the inverter 412 to generate a logic high '1' voltage that turns-off the second PMOS transistor 408.

With continuing reference to FIG. 4, without the pulse generation circuit 102, the source (S) of the third PMOS transistor 416 may receive the supply voltage of the first voltage domain (VDD1) (e.g., 1.0 V) while the input signal 114 provides a logic high '1' voltage in the second voltage domain (e.g., 0.5 V) to the gate (G) of the third PMOS transistor 416. In this manner, a gate-source voltage (Vgs) of the third PMOS transistor 416 may prevent the third PMOS transistor 416 from fully deactivating (e.g., Vgs=0.5 V−1.0 V=−0.5 V) for a time period while the clock signal 110 equals the evaluate voltage. Thus, the third PMOS transistor 416 may remain partially activated until the voltage on the source (S) of the third PMOS transistor 416 leaks to a level low enough to change the Vgs to a level capable of fully deactivating the third PMOS transistor 416. In this manner, the evaluate circuit 112 contends with the keeper circuit 116 for the time period while the clock signal 110 equals the evaluate voltage, thus decreasing the transition rate of the voltage on the dynamic node 108, and in some instances, preventing the voltage of the dynamic node 108 from being driven to the ground voltage (GND). One way to mitigate this contention is to increase the strength of the evaluate circuit 112 by increasing the size of the first and second NMOS transistors 402, 404. However, increasing the strength of the evaluate circuit 112 in this manner may increase the area of the dynamic voltage level shifter 400, which may increase power consumption and may reduce performance of the dynamic voltage level shifter 400.

With continuing reference to FIG. 4, the pulse generation circuit 102 is employed to mitigate the contention between the evaluate circuit 112 and the keeper circuit 116 without requiring an increase in strength and area of the first and second NMOS transistors 402, 404 of the evaluate circuit 112. In this manner, in response to the mimic clock signal 120 transitioning to the evaluate state (e.g., a logic high '1' voltage), the first delay circuit 200 provides the first edge trigger 208 to the pulse logic circuit 206. Further, in response to the mimic clock signal 120 transitioning to the evaluate voltage and the mimic input signal 122 having an active voltage (e.g., a logic high '1' voltage), the mimic dynamic voltage level shifter 202 generates the mimic shifted voltage signal 210 in the first voltage domain. The mimic shifted voltage signal 210 causes the second delay circuit 204 to generate the second edge trigger 212.

With continuing reference to FIG. 4, the pulse logic circuit 206 receives the first edge trigger 208 and the second edge trigger 212, and provides the pulse signal 118 to the keeper circuit 116. As described in further detail below, if the difference in the supply voltages of the first and second voltage domains exceeds a defined limit, the pulse width (PW) of the pulse signal 118 correlates to the difference in the supply voltages. In this manner, the pulse signal 118 causes the first PMOS transistor 406 to turn-off, which gates off the supply voltage of the first voltage domain (VDD1) from the source (S) of second PMOS transistor 408. As a result, the source (S) of the third PMOS transistor 416 is also gated off from the supply voltage of the first voltage domain (VDD1) in aspects that do not employ the NMOS transistor 418. In response to the source (S) of the third PMOS transistor 416 being gated off from the supply voltage of the first voltage domain (VDD1), the voltage at the source (S) of the third PMOS transistor 416 decreases. The decrease in the voltage at the source (S) of the third PMOS transistor 416 changes the Vgs of the third PMOS transistor 416 so as to fully deactivate the third PMOS transistor 416. Thus, deactivating the third PMOS transistor 416 in this manner reduces or eliminates the contention between the keeper circuit 116 and the evaluate circuit 112, which allows the voltage of the dynamic node 108 to be driven to the ground voltage (GND).

With continuing reference to FIG. 4, in aspects employing the NMOS transistor 418 in the keeper circuit 116, the pulse width (PW) of the pulse signal 118 activates the NMOS transistor 418. In this manner, rather than reducing the voltage on the source (S) of the third PMOS transistor 416 by gating off the supply voltage of the first voltage domain (VDD1), activation of the NMOS transistor 418 reduces the voltage on the source (S) by a threshold voltage (Vt) of the NMOS transistor 418. The reduction of the voltage on the source (S) also changes the Vgs of the third PMOS transistor 416 so as to reduce contention between the keeper circuit 116 and the evaluate circuit 112. Thus, the voltage of the dynamic node 108 may be driven to the ground voltage (GND) with reduced contention between the keeper circuit 116 and the evaluate circuit 112.

With continuing reference to FIG. 4, details of the pulse generation circuit 102 are now provided. Notably, the mimic dynamic voltage level shifter 202 includes components having a number "XM" that are similar to the previously described components of the dynamic voltage level shifter 400 having a number "X," and thus will not be re-described herein. In this manner, the mimic dynamic voltage level shifter 202 employs a mimic pre-charge circuit 106M that is configured to provide the supply voltage of the first voltage domain (VDD1) to a mimic dynamic node 108M while the mimic clock signal 120 equals a pre-charge voltage (e.g., a logic low '0' voltage). The mimic dynamic voltage level shifter 202 also employs a mimic evaluate circuit 112M that is configured to provide the ground voltage (GND) to the mimic dynamic node 108M in response to the mimic input signal 122 having an active voltage (e.g., a logic high '1' voltage) while the mimic clock signal 120 equals an evaluate value (e.g., a logic high '1' voltage). Further, the mimic dynamic voltage level shifter 202 employs a mimic keeper circuit 116M that is configured to provide the supply voltage of the first voltage domain (VDD1) to the mimic dynamic node 108M in response to the mimic input signal 122 having an inactive voltage (e.g., a logic low '0' voltage) while the mimic clock signal 120 equals the evaluate voltage. As previously described, the mimic keeper circuit 116M does not operate with a signal similar to the pulse signal 118. Thus, the mimic keeper circuit 116M does not include a transistor analogous to the first PMOS transistor 406 in the keeper circuit 116.

With continuing reference to FIG. 4, the pulse generation circuit 102 also employs the first delay circuit 200. The first delay circuit 200 includes an OR-based gate 420 (e.g., an OR gate 420) that is configured to receive the mimic clock signal 120, and an AND-based gate 422 (e.g., a NAND gate 422) that is configured to receive an output signal of the OR gate 420 and an enable signal 424. Notably, other aspects may include a NOR gate with an output coupled to an inverter in place of the OR gate 420. The first delay circuit 200 also includes a plurality of serially-coupled inverters 426(1)-426(N). In this example, the number "N" of inverters 426(1)-426(N) is an odd number due to inclusion of the NAND gate 422. The inverter 426(N) (also referred to as the "final inverter 426(N)") is configured to generate the first edge trigger 208 in response to the mimic clock signal 120. The pulse generation circuit 102 also includes the second delay circuit 204 that employs an AND-based gate 428 (e.g., a NAND gate 428). The NAND gate 428 is configured to receive the mimic shifted voltage signal 210 from the mimic dynamic voltage level shifter 202 and the enable signal 424, and provide the second edge trigger 212. Additionally, the pulse generation circuit 102 includes the pulse logic circuit 206. The pulse logic circuit 206 employs an AND-based gate 430 (e.g., a NAND gate 430) that is configured to receive the first edge trigger 208 and the second edge trigger 212. The pulse logic circuit 206 also employs an inverter 432 that is configured to receive an output signal of the NAND gate 430 and provide the pulse signal 118.

Figure 5A:
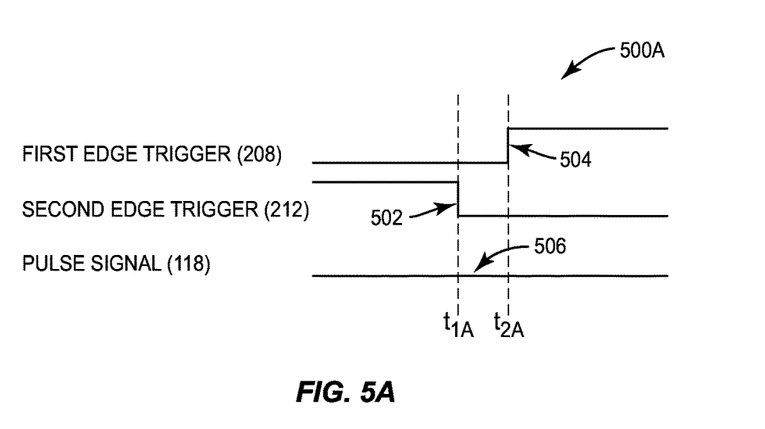
FIGS. 5A-5C are timing diagrams of exemplary signals corresponding to the dynamic voltage level shifter employing the pulse generation circuit in FIG. 4.
Figure 5B:
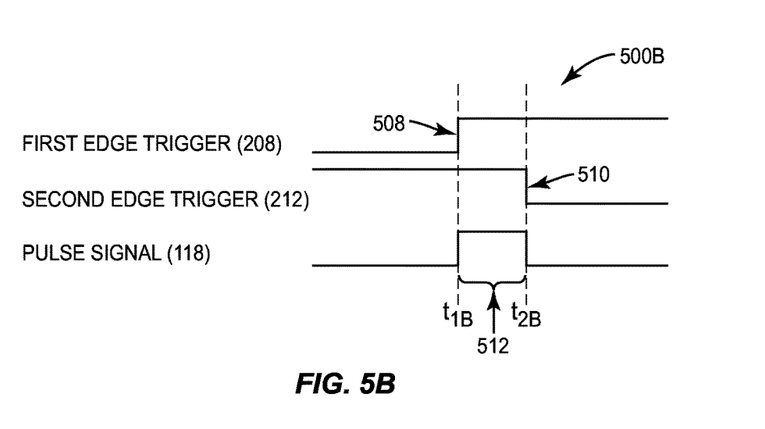
Figure 5C:
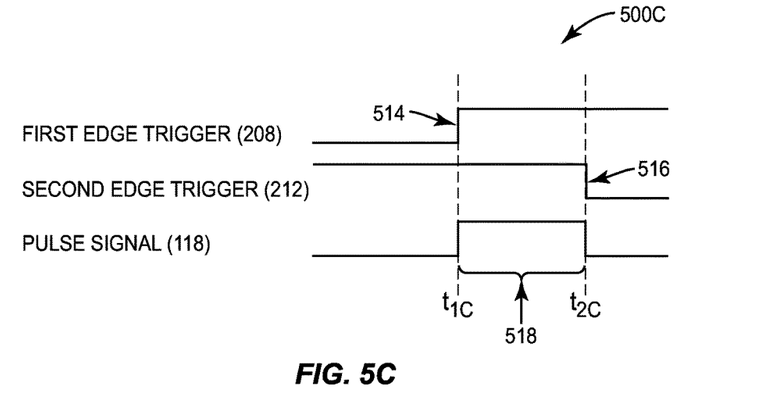

FIGS. 5A-5C illustrate timing diagrams 500A, 500B, and 500C, respectively, of exemplary signals corresponding to the dynamic voltage level shifter 400 in FIG. 4. In the timing diagram 500A in FIG. 5A, the second edge trigger 212 transitions to a logic low '0' voltage at time $t_{1A}$ (arrow 502), and the first edge trigger 208 transitions to a logic high '1' voltage at time $t_{2A}$ (arrow 504). The second edge trigger 212 transitioning to a logic low '0' voltage earlier in time than the first edge trigger 208 transitioning to a logic high '1' voltage in this manner indicates that the difference in the supply voltages of the first and second voltage domains is equal to or less than the defined limit. Thus, the pulse signal 118 is not generated (i.e., the pulse width (PW) is zero (0)) (arrow 506), as the difference in the supply voltages is not sufficient to enable gating off the first PMOS transistor 406 to weaken the keeper circuit 116. Further, in the timing diagram 500B in FIG. 5B, the first edge trigger 208 transitions to a logic high '1' voltage at time $t_{2B}$ (arrow 508), and the second edge trigger 212 transitions to a logic low '0' voltage at time $t_{2B}$ (arrow 510). The first edge trigger 208 transitioning to a logic high '1' voltage while the second edge trigger 212 has a logic high '1' voltage indicates that the difference in the supply voltages of the first and second voltage domains is greater than the defined limit. Thus, the pulse signal 118 has a pulse width (PW) (arrow 512), as the difference in the supply voltages is sufficient to enable gating off the first PMOS transistor 406 to weaken the keeper circuit 116 for a duration of the pulse width at arrow 512.

Additionally, in the timing diagram 500C in FIG. 5C, the first edge trigger 208 transitions to a logic high '1' voltage at time $t_{1C}$ (arrow 514), and the second edge trigger 212 transitions to a logic low '0' voltage at time $t_{2C}$ (arrow 516). The first edge trigger 208 transitioning to a logic high '1' voltage while the second edge trigger 212 has a logic high '1' voltage indicates that the difference in the supply voltages of the first and second voltage domains is greater than the defined limit. Thus, the pulse signal 118 has a pulse width (PW) (arrow 518), as the difference in the supply voltages is sufficient to enable gating off the first PMOS transistor 406 to weaken the keeper circuit 116 for a duration of the pulse width (PW) at arrow 518. Notably, the pulse width (PW) at arrow 518 is greater in duration than the pulse width (PW) at arrow 512 in FIG. 5B. The longer duration of the pulse width (PW) at arrow 518 indicates that the difference in the supply voltages of the first and second voltage domains is greater in FIG. 5C than the difference in FIG. 5B.

Figure 6:
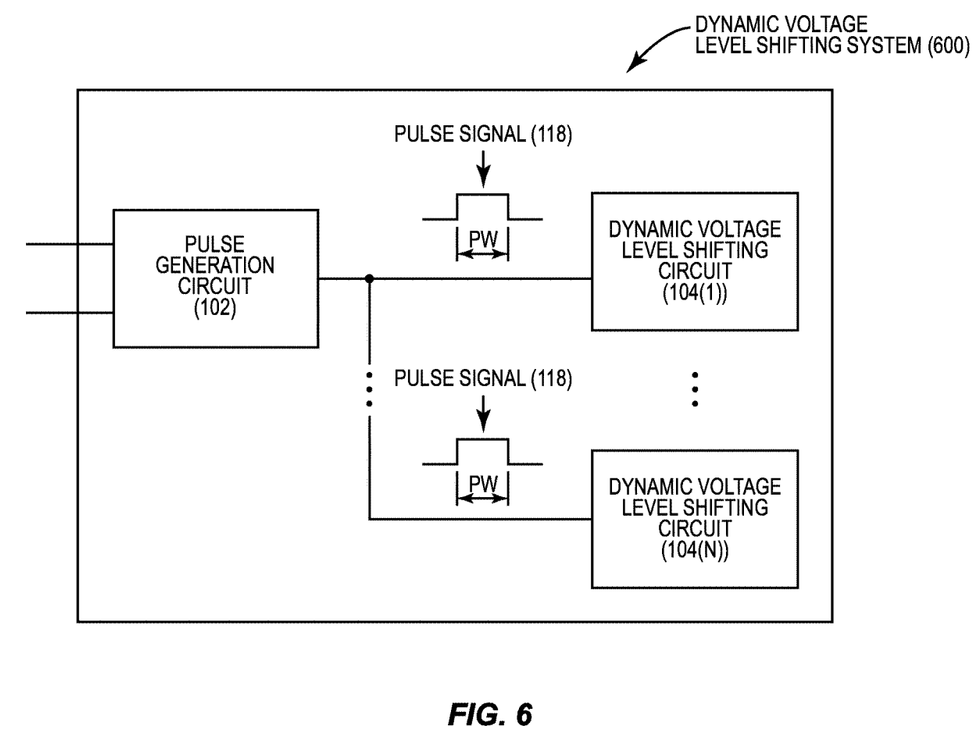
FIG. 6 is a block diagram of a dynamic voltage level shifting system employing one (1) pulse generation circuit configured to generate a pulse signal to reduce a drive strength of a keeper circuit employed by each of a plurality of dynamic voltage level shifting circuits.

Notably, although only one (1) dynamic voltage level shifting circuit 104 is illustrated in FIGS. 1 and 4, one (1) instance of the pulse generation circuit 102 may be employed to generate the pulse signal 118 for multiple dynamic voltage level shifting circuits 104(1)-104(N). In this regard, FIG. 6 illustrates a dynamic voltage level shifting system 600 employing the pulse generation circuit 102 to provide the pulse signal 118 to each of the dynamic voltage level shifting circuits 104(1)-104(N). As previously described, the pulse generation circuit 102 may reduce or avoid concurrent partial activation of the keeper circuit 116 and the evaluate circuit 112 in each of the dynamic voltage level shifting circuits 104(1)-104(N) without the need to increase the strength and area of each evaluate circuit 112. In this manner, employing one (1) instance of the pulse generation circuit 102 with the dynamic voltage level shifting circuits 104(1)-104(N) may consume less area than employing a larger evaluate circuit 112 in each of the dynamic voltage level shifting circuits 104(1)-104(N).

The dynamic voltage level shifters employing pulse generation circuits according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 7:
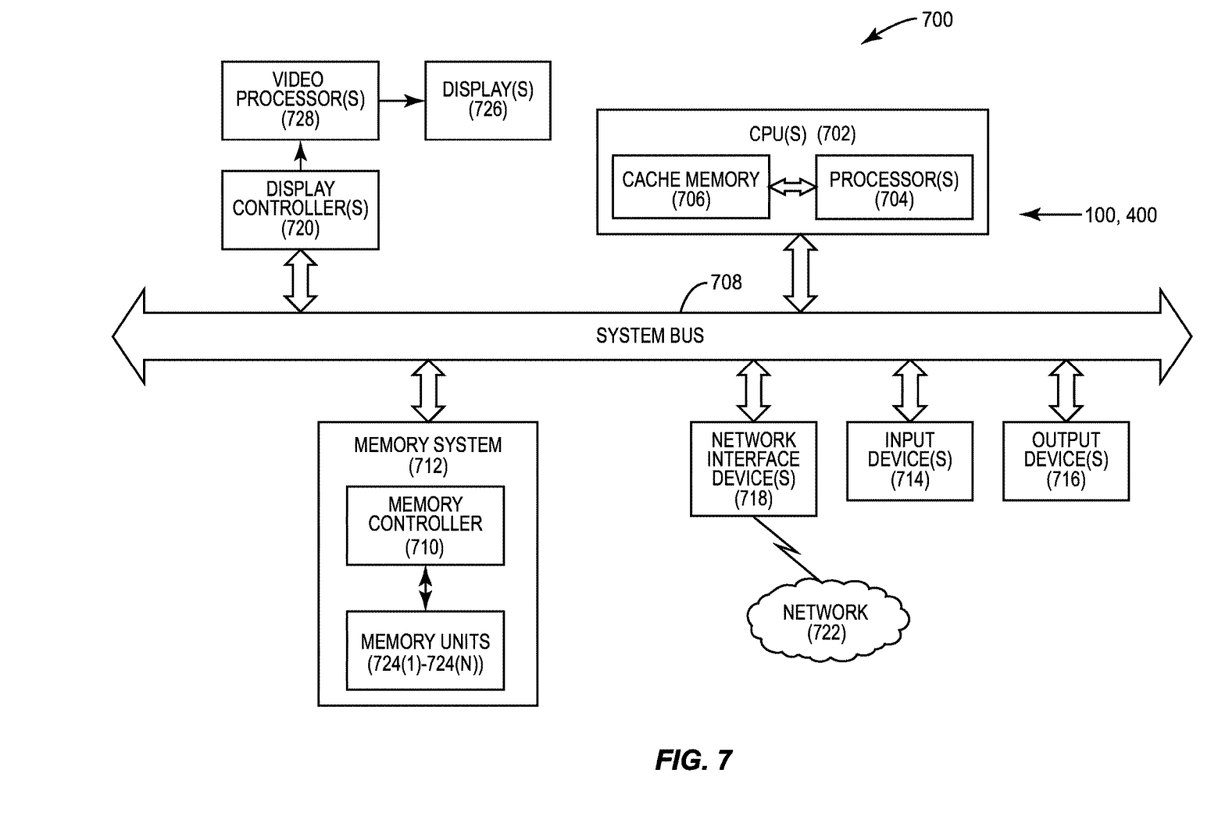
FIG. 7 is a block diagram of an exemplary processor-based system that can include the dynamic voltage level shifters in FIGS. 1 and 4, as well as the dynamic voltage level shifting system in FIG. 6.

In this regard, FIG. 7 illustrates an example of a processor-based system 700. Notably, any element described herein in relation to the processor-based system 700 can include the dynamic voltage level shifters 100, 400 illustrated in FIGS. 1 and 4, respectively. In this example, the processor-based system 700 includes one or more central processing units (CPUs) 702, each including one or more processors 704. The CPU(s) 702 may have cache memory 706 coupled to the processor(s) 704 for rapid access to temporarily stored data. The CPU(s) 702 is coupled to a system bus 708 and can intercouple master and slave devices included in the processor-based system 700. As is well known, the CPU(s) 702 communicates with these other devices by exchanging address, control, and data information over the system bus 708. For example, the CPU(s) 702 can communicate bus transaction requests to a memory controller 710 as an example of a slave device. Although not illustrated in FIG. 7, multiple system buses 708 could be provided, wherein each system bus 708 constitutes a different fabric.

Other master and slave devices can be connected to the system bus 708. As illustrated in FIG. 7, these devices can include a memory system 712, one or more input devices 714, one or more output devices 716, one or more network interface devices 718, and one or more display controllers 720, as examples. The input device(s) 714 can include any type of input device, including but not limited to input keys, switches, voice processors, etc. The output device(s) 716 can include any type of output device, including but not limited to audio, video, other visual indicators, etc. The network interface device(s) 718 can be any device configured to allow exchange of data to and from a network 722. The network 722 can be any type of network, including but not limited to a wired or wireless network, a private or public network, a local area network (LAN), a wireless local area network (WLAN), a wide area network (WAN), a BLUETOOTH™ network, or the Internet. The network interface device(s) 718 can be configured to support any type of communications protocol desired. The memory system 712 can include one or more memory units 724(1)-724(N).

The CPU(s) 702 may also be configured to access the display controller(s) 720 over the system bus 708 to control information sent to one or more displays 726. The display controller(s) 720 sends information to the display(s) 726 to be displayed via one or more video processors 728, which process the information to be displayed into a format suitable for the display(s) 726. The display(s) 726 can include any type of display, including but not limited to a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A dynamic voltage level shifter, comprising:
   a dynamic voltage level shifting circuit, comprising:
      a pre-charge circuit configured to provide a supply voltage of a first voltage domain to a dynamic node in response to a clock signal in the first voltage domain having a pre-charge voltage;
      an evaluate circuit configured to provide a ground voltage to the dynamic node in response to an input signal in a second voltage domain while the clock signal has an evaluate voltage; and
      a keeper circuit configured to provide a reduced drive strength to the dynamic node in response to a pulse signal; and
   a pulse generation circuit configured to generate the pulse signal, wherein a pulse width of the pulse signal correlates to a difference in the supply voltage of the first voltage domain and a supply voltage of the second voltage domain.

2. The dynamic voltage level shifter of claim 1, wherein the pulse generation circuit is configured to generate the pulse signal by being configured to generate a first transition of the pulse signal in response to a signal in the first voltage domain.

3. The dynamic voltage level shifter of claim 2, wherein the pulse generation circuit is configured to generate the pulse signal by being further configured to generate a second transition of the pulse signal in response to a signal in the second voltage domain.

4. The dynamic voltage level shifter of claim 1, wherein the pulse generation circuit comprises a mimic dynamic voltage level shifter configured to:
   receive a mimic input signal in the second voltage domain;
   receive a mimic clock signal in the first voltage domain; and
   generate a mimic shifted voltage signal in the first voltage domain.

5. The dynamic voltage level shifter of claim 4, wherein the pulse generation circuit further comprises:
   a first delay circuit configured to:
      receive the mimic clock signal; and
      generate a first edge trigger;
   a second delay circuit configured to:
      receive the mimic shifted voltage signal; and
      generate a second edge trigger; and
   a pulse logic circuit configured to:
      generate a first transition of the pulse signal in response to the first edge trigger; and
      generate a second transition of the pulse signal in response to the second edge trigger.

6. The dynamic voltage level shifter of claim 5, wherein the mimic dynamic voltage level shifter comprises:
   a mimic pre-charge circuit configured to provide the supply voltage of the first voltage domain to a mimic dynamic node in response to the mimic clock signal having a pre-charge voltage;
   a mimic evaluate circuit configured to provide a ground voltage to the mimic dynamic node in response to the mimic input signal having an active voltage while the mimic clock signal has an evaluate voltage; and
   a mimic keeper circuit configured to provide the supply voltage of the first voltage domain to the mimic dynamic node in response to the mimic input signal having an inactive voltage while the mimic clock signal has the evaluate voltage.

7. The dynamic voltage level shifter of claim 5, wherein the first delay circuit comprises:
   an OR-based gate configured to receive the mimic clock signal; and
   a plurality of serially-coupled inverters, wherein a final inverter of the plurality of serially-coupled inverters is configured to generate the first edge trigger in response to the mimic clock signal.

8. The dynamic voltage level shifter of claim 5, wherein the second delay circuit comprises an AND-based gate configured to:
   receive the mimic shifted voltage signal; and
   generate the second edge trigger.

9. The dynamic voltage level shifter of claim 5, wherein the pulse logic circuit comprises:
   an AND-based gate configured to:
      receive the first edge trigger; and
      receive the second edge trigger; and
   an inverter configured to:
      receive an output signal of the AND-based gate; and
      generate the pulse signal.

10. The dynamic voltage level shifter of claim 1, wherein the keeper circuit comprises a first p-type metal-oxide semiconductor (PMOS) transistor comprising:
    a source configured to receive the supply voltage of the first voltage domain;
    a gate configured to receive the pulse signal; and
    a drain configured to:
       provide the supply voltage of the first voltage domain in absence of the pulse signal; and
       provide no voltage in response to the pulse signal.

11. The dynamic voltage level shifter of claim 10, wherein the keeper circuit further comprises an n-type MOS (NMOS) transistor comprising:
    a source configured to receive the supply voltage of the first voltage domain;
    a gate configured to receive the pulse signal; and
    a drain configured to provide a voltage approximately equal to the supply voltage of the first voltage domain minus a threshold voltage of the NMOS transistor in response to the pulse signal.

12. The dynamic voltage level shifter of claim 10, wherein the keeper circuit further comprises a second PMOS transistor comprising:
    a source coupled to the drain of the first PMOS transistor;
    a gate configured to receive an inverted dynamic node signal; and
    a drain.

13. The dynamic voltage level shifter of claim 12, wherein the keeper circuit further comprises a third PMOS transistor comprising:
    a source coupled to the drain of the second PMOS transistor;
    a gate coupled to the input signal; and
    a drain coupled to the dynamic node.

14. The dynamic voltage level shifter of claim 1 integrated into an integrated circuit (IC).

15. The dynamic voltage level shifter of claim 1 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

16. A dynamic voltage level shifter, comprising:
    a means for pre-charging a dynamic node to a supply voltage of a first voltage domain in response to a clock signal in the first voltage domain having a pre-charge voltage;
    a means for providing a ground voltage to the dynamic node in response to an input signal in a second voltage domain while the clock signal has an evaluate voltage;
    a means for providing a reduced drive strength to the dynamic node in response to a pulse signal; and
    a means for generating the pulse signal, wherein a pulse width of the pulse signal correlates to a difference in the supply voltage of the first voltage domain and a supply voltage of the second voltage domain.

17. A method for voltage level shifting, comprising:
    pre-charging a dynamic node to a supply voltage of a first voltage domain in response to a clock signal in the first voltage domain having a pre-charge voltage;
    providing a ground voltage to the dynamic node in response to an input signal in a second voltage domain while the clock signal has an evaluate voltage;
    generating a pulse signal, wherein a pulse width of the pulse signal correlates to a difference in the supply voltage of the first voltage domain and a supply voltage of the second voltage domain; and
    providing a reduced drive strength to the dynamic node by a keeper circuit in response to the pulse signal.

18. The method of claim 17, wherein generating the pulse signal comprises generating a first transition of the pulse signal in response to a signal in the first voltage domain.

19. The method of claim 18, wherein generating the pulse signal further comprises generating a second transition of the pulse signal in response to a signal in the second voltage domain.

20. A dynamic voltage level shifting system, comprising:
    a plurality of dynamic voltage level shifting circuits, each dynamic voltage level shifting circuit of the plurality of dynamic voltage level shifting circuits comprising:
       a pre-charge circuit configured to provide a supply voltage of a first voltage domain to a dynamic node in response to a clock signal in the first voltage domain having a pre-charge voltage;
       an evaluate circuit configured to provide a ground voltage to the dynamic node in response to an input signal in a second voltage domain while the clock signal has an evaluate voltage; and
       a keeper circuit configured to provide a reduced drive strength to the dynamic node in response to a pulse signal; and
    a pulse generation circuit configured to generate the pulse signal, wherein a pulse width of the pulse signal correlates to a difference in the supply voltage of the first voltage domain and a supply voltage of the second voltage domain.

21. The dynamic voltage level shifting system of claim 20, wherein the pulse generation circuit is configured to generate the pulse signal by being configured to generate a first transition of the pulse signal in response to a signal in the first voltage domain.

22. The dynamic voltage level shifting system of claim 21, wherein the pulse generation circuit is configured to generate the pulse signal by being further configured to generate a second transition of the pulse signal in response to a signal in the second voltage domain.

23. The dynamic voltage level shifting system of claim 20, wherein the pulse generation circuit comprises a mimic dynamic voltage level shifter configured to:
receive a mimic input signal in the second voltage domain;
receive a mimic clock signal in the first voltage domain; and
generate a mimic shifted voltage signal in the first voltage domain.

24. The dynamic voltage level shifting system of claim 23, wherein the pulse generation circuit further comprises:
a first delay circuit configured to:
receive the mimic clock signal; and
generate a first edge trigger;
a second delay circuit configured to:
receive the mimic shifted voltage signal; and
generate a second edge trigger; and
a pulse logic circuit configured to:
generate a first transition of the pulse signal in response to the first edge trigger; and
generate a second transition of the pulse signal in response to the second edge trigger.

25. The dynamic voltage level shifting system of claim 24, wherein the mimic dynamic voltage level shifter comprises:
a mimic pre-charge circuit configured to provide the supply voltage of the first voltage domain to a mimic dynamic node in response to the mimic clock signal having a pre-charge voltage;
a mimic evaluate circuit configured to provide a ground voltage to the mimic dynamic node in response to the mimic input signal having an active voltage while the mimic clock signal has an evaluate voltage; and
a mimic keeper circuit configured to provide the supply voltage of the first voltage domain to the mimic dynamic node in response to the mimic input signal having an inactive voltage while the mimic clock signal has the evaluate voltage.

26. The dynamic voltage level shifting system of claim 20 integrated into an integrated circuit (IC).

27. The dynamic voltage level shifting system of claim 20 integrated into a device selected from the group consisting of: a set top box; an entertainment unit; a navigation device; a communications device; a fixed location data unit; a mobile location data unit; a mobile phone; a cellular phone; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; and a portable digital video player.

* * * * *

UNITED STATES PATENT AND TRADEMARK OFFICE
CERTIFICATE OF CORRECTION

PATENT NO. : 9,608,637 B2
APPLICATION NO. : 14/827125
DATED : March 28, 2017
INVENTOR(S) : Chiaming Chai et al.

Page 1 of 1

It is certified that error appears in the above-identified patent and that said Letters Patent is hereby corrected as shown below:

In the Specification

At Column 11, Line 11, change "at time $t_{2B}$" to --at time $t_{1B}$--.

Signed and Sealed this
Eleventh Day of July, 2017

Joseph Matal
*Performing the Functions and Duties of the*
*Under Secretary of Commerce for Intellectual Property and*
*Director of the United States Patent and Trademark Office*